US012561218B2

(12) United States Patent
Klein et al.

(10) Patent No.: US 12,561,218 B2
(45) Date of Patent: Feb. 24, 2026

(54) AUTOMATIC FUNCTIONAL TEST PATTERN GENERATION BASED ON DUT REFERENCE MODEL AND UNIQUE SCRIPTS

(71) Applicant: WINBOND ELECTRONICS CORPORATION, Taichung (TW)

(72) Inventors: Tal Klein, Kfar Saba (IL); Ronny Aboutboul, Zikhron Yaakov (IL); Yoram Avigdor, Kfar Saba (IL); Erez Glasberg, Herzliya (IL)

(73) Assignee: Winbond Electronics Corporation, Taichung (TW)

( * ) Notice: Subject to any disclaimer, the term of this patent is extended or adjusted under 35 U.S.C. 154(b) by 996 days.

(21) Appl. No.: 17/713,260

(22) Filed: Apr. 5, 2022

(65) Prior Publication Data

US 2023/0315598 A1 Oct. 5, 2023

(51) Int. Cl.
G06F 11/27 (2006.01)
G06F 30/20 (2020.01)

(52) U.S. Cl.
CPC .............. G06F 11/27 (2013.01); G06F 30/20 (2020.01)

(58) Field of Classification Search
CPC ................................ G06F 11/27; G06F 30/20
USPC .......................................................... 703/21
See application file for complete search history.

(56) References Cited

U.S. PATENT DOCUMENTS 6,052,809 A * 4/2000 Bowden ......... G01R 31/318342
714/741
6,205,407 B1 3/2001 Testa et al.

6,334,100 B1 12/2001 Ahrikencheikh et al.
6,925,617 B2 8/2005 Bayraktaroglu et al.
11,036,907 B2 6/2021 Boutobza et al.
2008/0244347 A1 * 10/2008 Fisher .................... G06F 30/33
714/741

(Continued)

FOREIGN PATENT DOCUMENTS

CN 113127019 A 7/2021
JP H0348782 A 3/1991

(Continued)

OTHER PUBLICATIONS

TW Application # 112107970 Office Action dated Jan. 4, 2024.

(Continued)

*Primary Examiner* — Andre Pierre Louis
(74) *Attorney, Agent, or Firm* — Meitar Patents Ltd.; Daniel Kligler

(57) ABSTRACT

An apparatus for generating Automatic Test Equipment (ATE) testing patterns to test an electronic device-under-test (DUT) that includes electrical circuitry, at least one input port and at least one output port. The apparatus includes a memory and a processor. The memory is configured to store (i) a high-level verification language (HVL) model of the IC, including a model input that models the at least one DUT input port and a model output that models the at least one DUT output port, the HVL model configured to determine, obliviously to the electrical circuitry, a logic state of the model output responsively to a logic state of the model input, and (ii) a simulation program, configured to simulate the HVL model of the DUT. The processor is configured to generate an ATE testing pattern for the DUT by running the simulation program.

15 Claims, 3 Drawing Sheets

(56) References Cited

U.S. PATENT DOCUMENTS

| | | | |
|---|---|---|---|
| 2011/0055780 A1 | 3/2011 | Venell | |
| 2019/0005177 A1 | 1/2019 | Sharma et al. | |
| 2020/0272701 A1* | 8/2020 | Robertson | G06F 30/3323 |
| 2020/0279064 A1* | 9/2020 | Boutobza | G06F 30/337 |

FOREIGN PATENT DOCUMENTS

| | | |
|---|---|---|
| JP | H06194416 A | 7/1994 |
| JP | 2001174527 A | 6/2001 |
| JP | 2001272442 A | 10/2001 |
| JP | 2007058596 A | 3/2007 |
| JP | 2009276321 A | 11/2009 |
| JP | 2010244300 A | 10/2010 |
| JP | 2012167958 A | 9/2012 |
| KR | 100939642 B1 | 1/2010 |
| WO | 2010030450 A2 | 3/2010 |

OTHER PUBLICATIONS

Iyer, "Race: A World-Level ATPG-Based Constraints Solver System For Smart Simulation," IEEE International Test Conference, Paper 11.4, pp. 299-308, year 2003.

Touati, "Improving Functional and Strutural Test Solutions for Integrated Circuits," Doctoral Thesis, Electrics, Montpellier University, submitted Oct. 15, 2016.

Zhang et al., "Efficient Sequential ATPG for Functional RTL Circuits," Proceedings of the IEEE International Test Conference, pp. 290-298, Sep. 2003.

Draft Standard for e Language Reference, "Preliminary e Language Reference Draft," P1647/DO.1, Chapter 2, "e Basics," pp. 3-40, Dec. 4, 2003.

JP Application # 2023043655 Office Action dated Sep. 25, 2024.

JP Application # 2023043655 Office Action dated Feb. 4, 2025.

KR Application # 1020230035914 Office Action dated Feb. 20, 2025.

JP Application # 2023043655 Office Action dated May 31, 2024.

Boule et al., "Assertion Checkers in Verification, Silicon Debug and In-Field Diagnosis," Proceedings of ISQED '07, 8th International Symposium on Quality of Electronic Design, pp. 1-7, Mar. 2007.

European Patent Application # 23161187.2 Search Report dated Aug. 25, 2023.

* cited by examiner

100

102

106

104

108 Processor

110

116 DUT HVL Model

118 HVL Simulator

120 Stimuli file

122 I/O Log

124 Translation Program

126 ATE pattern

114 AUTOMATIC TEST EQUIPMENT (ATE)

112 DUT

*300*

START

GET DUT HVL MODEL — *302*

GET STIMULI FILE — *304*

RUN HVL SIMULATION, INPUT STIMULI, MONITOR INPUTS AND OUTPUTS — *306*

CONVERT THE MONITORED INPUTS AND OUTPUTS TO ATE PATTERN FILE — *308*

END

AUTOMATIC FUNCTIONAL TEST PATTERN GENERATION BASED ON DUT REFERENCE MODEL AND UNIQUE SCRIPTS

FIELD OF THE INVENTION

The present invention relates generally to electrical testing, and particularly to methods and systems for the generation of integrated circuit test patterns.

BACKGROUND OF THE INVENTION

Integrated circuits (ICs) may be tested at the wafer-level ("wafer-sort") and at the packaged-unit level, using an Automatic Test Equipment (ATE) that runs a test pattern.

U.S. Pat. No. 6,205,407 describes a system and method of generating test code for testing an electronic device on an Automatic Test Equipment (ATE) platform, which translates scan and pattern test data into test code based upon user defined settings. The test data preferably comes from a test data generation program such as a Scan ATPG or Simulation program, which generates test data. The test data is serially streamed to the system by the use of function calls embedded in the test data generation program. The user, preferably using a Graphical User Interface (GUI), defines the desired ATE platform type, as well as other custom format features for the output data. The translation, preferably running simultaneously with the test data generation plan, produces the test code as the test data is generated.

U.S. Pat. No. 6,925,617 describes a method to generate a test pattern for an integrated circuit (IC) design using a functional verification program. The functional verification program includes a stimulus generator, an expected-response generator, and an interface defining ports of the IC design. The method includes (a) converting input ports in the interface into bi-directional in/out ports, (b) supplying stimuli to the converted in/out ports and original in/out ports in the interface by executing the stimulus generator, (c) sampling the stimuli supplied to the converted in/out ports and the original in/out ports, and (d) recording the sampled stimuli. The method may further include (e) creating bi-directional shadow ports in the interface, the shadow ports corresponding to the in/out ports and output ports of the IC design, (f) supplying expected responses to the shadow ports by executing the expected-response generator, (g) sampling the expected responses from the shadow ports, and (h) recording the sampled expected response.

SUMMARY OF THE INVENTION

An embodiment of the present invention that is described herein provides an apparatus for generating Automatic Test Equipment (ATE) testing patterns to test an electronic device-under-test (DUT) that includes electrical circuitry, at least one input port and at least one output port. The apparatus includes a memory and a processor. The memory is configured to store (i) a high-level verification language (HVL) model of the IC, including a model input that models the at least one DUT input port and a model output that models the at least one DUT output port, the HVL model configured to determine, obliviously to the electrical circuitry, a logic state of the model output responsively to a logic state of the model input, and (ii) a simulation program, configured to simulate the HVL model of the DUT. The processor is configured to generate an ATE testing pattern for the DUT by running the simulation program.

In some embodiments, the memory is further configured to store a translation program for translating the logic states of the model input and the model output into the ATE testing pattern, and the processor is configured to generate the ATE testing pattern by running the translation program.

In an embodiment, the memory is further configured to store a stimuli file to indicate a stimulus to be applied to the model input. In an example embodiment, the processor is configured to store, in the memory, an interim I/O log file including the logic state of the model output. The processor may be configured to store, in the interim I/O log file, high level debug simulation data. In a disclosed embodiment, the memory is further configured to store a pattern file including the ATE testing pattern. In another embodiment, the ATE testing pattern includes a comma-separated-values (CSV) file.

There is additionally provided, in accordance with an embodiment that is described herein, a method for generating Automatic Test Equipment (ATE) testing patterns to test an electronic device-under-test (DUT) that includes electrical circuitry, at least one input port and at least one output port. The method includes storing in a memory a high-level verification language (HVL) model of the IC, including a model input that models the at least one DUT input port and a model output that models the at least one DUT output port, the HVL model configured to determine, obliviously to the electrical circuitry, a logic state of the model output responsively to a logic state of the model input. A simulation program, configured to simulate the HVL model of the DUT, is further stored in the memory. An ATE testing pattern for the DUT is generated by running the simulation program.

There is also provided, in accordance with an embodiment that is described herein, a computer software product for generating Automatic Test Equipment (ATE) testing patterns to test an electronic device-under-test (DUT) that includes electrical circuitry, at least one input port and at least one output port. The product includes a tangible non-transitory computer-readable medium in which program instructions are stored, which instructions, when read by a processor, cause the processor to store in a memory a high-level verification language (HVL) model of the IC, including a model input that models the at least one DUT input port and a model output that models the at least one DUT output port, the HVL model configured to determine, obliviously to the electrical circuitry, a logic state of the model output responsively to a logic state of the model input, to further store in the memory a simulation program, configured to simulate the HVL model of the DUT, and to generate an ATE testing pattern for the DUT by running the simulation program.

The present invention will be more fully understood from the following detailed description of the embodiments thereof, taken together with the drawings in which:

DETAILED DESCRIPTION OF EMBODIMENTS

Overview

Automatic Test Equipment (ATE) is widely used for the production testing of Integrated circuits (ICs) and other electronic devices (collectively referred to, in testing nomenclature, as Device Under Test, or DUT). The ATE drives the input ports of the DUT and checks whether the output ports assume a preset level (the input and output ports are also referred to as "terminals", "pads" or "pins".).

The list of values to be applied to the DUT inputs and the expected responsive values of the DUT outputs are typically listed in a Comma-Separated-Values (CSV) testing pattern file.

One way to generate a testing pattern file for the testing of a DUT involves running a functional test of the DUT on a DUT simulation model that models the circuitry of the DUT, monitoring the inputs and outputs of the DUT model and generating a corresponding test pattern. However, the simulation of a DUT, which comprises millions or sometimes billions of devices, may be very lengthy.

Embodiments of the present invention that are disclosed herein provide for methods and apparatuses to rapidly generate functional testing pattern for DUTs. In an embodiment, a computer simulates a Hardware Verification Language (HVL) model of the integrated circuit, that defines the response of the DUT to any stimuli obliviously to the circuitry of the DUT. In some embodiments, the HVL model simulates substantially faster than a model that simulates the circuitry of the DUT.

In embodiments, the computer keeps an interim I/O log file of the simulation and may then run a translation program that translates the interim I/O log file to an ATE test pattern.

System Description

The embodiments disclosed herein refer to the generation of test patterns for the automatic testing of integrated circuits (ICs). The disclosed techniques, however, can also be used for the generation of test patterns for the automatic testing of systems (e.g., a Multi-Chip Module, or MCM) or any other electronic circuits. We will sometimes refer to the tested entity as Device Under Test (DUT).

Figure 1:
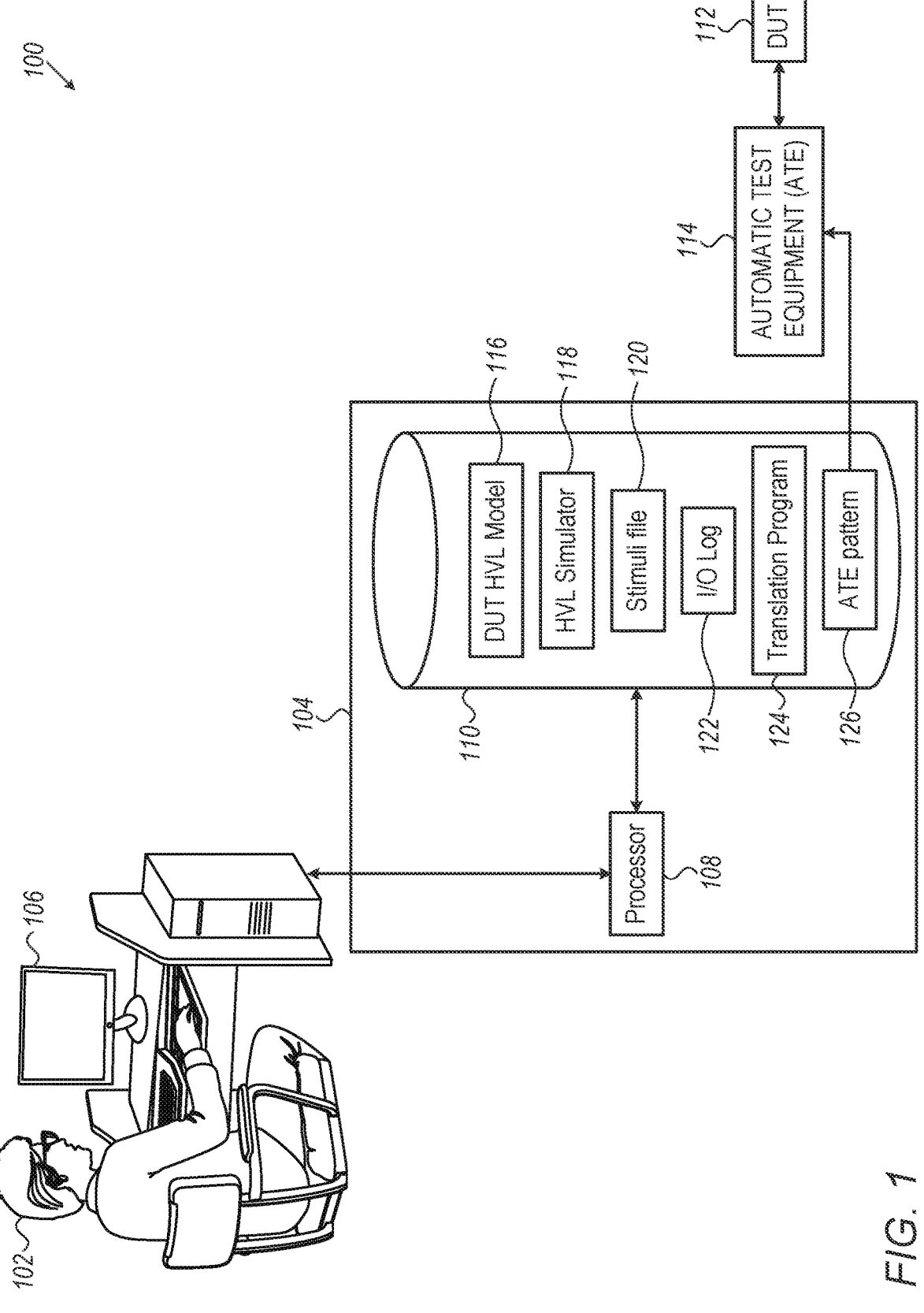
FIG. 1 is a hardware-centric block diagram that schematically illustrates a system for ATE pattern generation of an Integrated Circuit (IC), in accordance with an embodiment of the present invention.

FIG. 1 is a hardware-centric block diagram that schematically illustrates a system 100 for the test-pattern generation of an Integrated Circuit (IC), in accordance with an embodiment of the present invention.

In the present example, a User 102 (e.g., a test engineer) communicates with a computer 104 through a human-interface 106 (which typically includes a monitor, a pointing device, and a keyboard). Computer 104 comprises a processor 108 and a memory 110. (Computer 104 and Human Interface 106, including the various hardware and software elements therefor, will be sometimes referred to hereinbelow as an apparatus for generating ATE test patterns).

User 102 wishes to generate test patterns to test a Device Under Test (DUT) 112 (e.g., an IC) by an Automatic Test Equipment (ATE) 114. The test patterns are commonly formatted as comma-separated-values (CSV) files, that include input stimuli to be applied to the DUT inputs and responsive outputs that the DUT is expected to generate (DUT 112 may also include bidirectional ports, which are driven by the input stimuli and generate responsive outputs; the handling of bidirectional ports according to an embodiment will be described below).

According to the example embodiment illustrated in FIG. 1, User 102 runs software that is stored in memory 110 of computer 104, to generate the test patterns. The software includes a Hardware-Verification-Language (HVL) model 116 of DUT 112, and an HVL simulator 118. In embodiments, the HVL model of the DUT describes the input-output behavior of the DUT obliviously to the actual electrical circuitry. In other words, different circuit implementations that output the same outputs given the same inputs, will be described by the same HVL model.

DUT 112 may comprise a variety of internal circuits to calculate and output binary numbers and logic indications on the DUT's output pins, responsively to input binary numbers and input indications that are applied on the DUT's input pins, and to the internal state of the DUT. The HVL model is configured to produce the same output numbers and indications, without any knowledge of the DUT circuits and functionality.

As a simplified example, the DUT may comprise a hardware divider to divide two numbers or may comprise circuitry that implements a hardware division algorithm; the HVL model may comprise the same statement A=B/C for both implementations, to achieve the same result. By contrast, structural models of the DUT (e.g., Verilog models) typically include models of all the internal DUT circuits. Simulation of a structural level model, therefore, is much slower than the simulation of an HVL-level model. In some cases, the HVL level simulation is faster by at least two orders of magnitude.

An example for a language for writing HVL models (and for generating tests to test the models) is the e language. (For e language reference see, for example, "Preliminary e Language Reference Draft—CSE IIT Kgp"; chapter 2: "e Basics", which describes the basic structure of the language. Alternatively, any other suitable kind of HVL can be used.

Memory 110 further stores HVL simulator 118, that is configured to simulate the HVL model, and a stimuli file 120, which comprises input vectors to be applied to the HVL model input ports by HVL simulator 118.

When processor 108 of computer 104 simulates DUT HVL Model 116 using HVL Simulator 118 and applying stimuli 120, the simulator monitors the input and output ports of the DUT model and stores the monitored values in an input-output ports log file 122 (also referred to as Interim I/O Log file). In some embodiments, the HVL simulator may add high level debug data to the interim I/O file (for example, if the DUT is a processor running software, the HVL simulator may add the processor instructions corresponding to the monitored I/O values). As will be described below, such additional high-level debug data may be used to ease the debug of the test pattern.

After the simulation successfully completes, User 102 may run a Translation Program 124, which reads the I/O log file and generates an ATE pattern file 126 (e.g., a CSV-format file), which may then be downloaded by ATE 114. (The I/O log files can also be used for debug in case problems are found.) Thus, using an HVL model rather than a structural model of the HDL and format translation program 124, User 102 can generate test patterns 126 for ATE 114 in a relatively short time. The interim I/O log files may be used to ease debug of the test program.

The configuration of system 100 illustrated in FIG. 1 and described hereinabove is an example that is cited for the sake of conceptual clarity. Other configurations may be used in alternative embodiments. For example, ATE pattern generation (using computer 104) and execution of the tests (using ATE 114) may be performed at different locations. In other words, the connection in FIG. 1 between computer 104 and ATE 114 may be a logical connection (e.g., by any means of file transfer), not necessarily a physical connection.

As another example, the various components of memory 110 may be distributed in multiple computers; part or all the components may be stored in a communication-network "cloud". In some embodiments, the HVL comprises automatic generation of test patterns, using, for example, randomly generated tests, and, hence, the stimuli file may not be needed.

Figure 2:
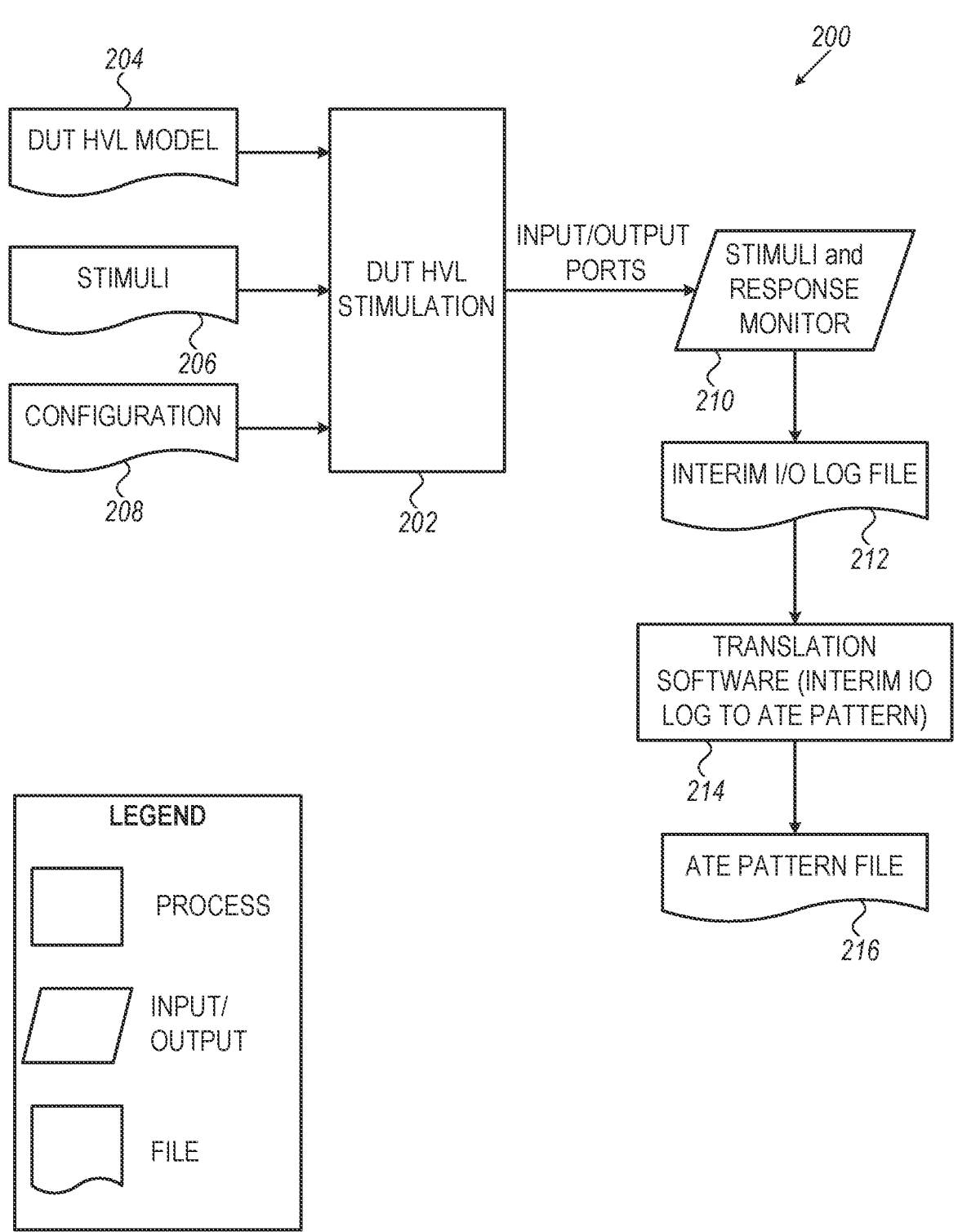
FIG. 2 is a software-centric block diagram that schematically illustrates an ATE pattern generation system, in accordance with an embodiment of the present invention.

FIG. 2 is a software-centric block diagram that schematically illustrates an ATE pattern generation system 200, in accordance with an embodiment of the present invention. A DUT simulator 202 simulates an HVL DUT model 204, applying stimuli from a stimuli file 206, and using a configuration set by a configuration file 208. In some embodiments, configuration file 208 may select one of several DUT configuration options, and/or one of several simulator options.

A Stimuli and Response monitor 210 monitors the state of the DUT model ports (inputs and outputs), and stores the monitored values in an Interim I/O Log File 212 (in some embodiments, the Interim I/O Log file may further comprise high level debug simulation data). A Translator program 214 then translates the I/O Log file into a CSV ATE pattern file 216. The translation program typically comprises a script, written in some scripting language (e.g., Powershell, AWK or PERL).

The configuration of software-centric pattern-generation system 200, illustrated in FIG. 2 and described hereinabove is an example configuration that is cited by way of example. Other configurations may be used in alternative embodiments. In some embodiments, for example, there is no configuration file; instead, the simulation program prompts a user to enter configuration options, typically before the simulation starts. In other embodiments there is no configuration file because the configuration is fixed. In an embodiment, the Stimuli file is generated by the simulation software (e.g., when the simulator is configured to generate random test patterns).

Debug

In some embodiments, the HVL simulator inserts high-level debug simulation data in the interim I/O log file, pertaining to the monitored I/O values. For example, if the DUT is a processor, the interim I/O file may include lines pertaining to the I/O values in consecutive time periods and, in each line, the corresponding processor instruction.

If the testing program fails, the interim I/O file may be used to debug the test pattern; in embodiments, such debug may be easier than debugging the ATE test patterns, which do not include high level simulation data.

Bidirectional Ports

In some embodiments, the DUT may comprise bidirectional ports, which may function, at different time periods, as input to the DUT or as output from the DUT. In an embodiment, the HVL model of the DUT comprises direction indications for each such bidirectional pin (sometimes a single indication determines the direction of a group of ports, e.g., a bidirectional data bus).

In some embodiments, the HVL simulator monitors the direction-indication signals, which are then stored in Interim I/O Log file 212 (FIG. 2), and the translation software 214 adds direction indication columns to the ATE CSV file. The ATE will drive the bidirectional ports only when the corresponding direction indication indicates that the port is an input.

Method Description

We will now proceed to describe a method for ATE pattern generation, according to embodiments.

Figure 3:
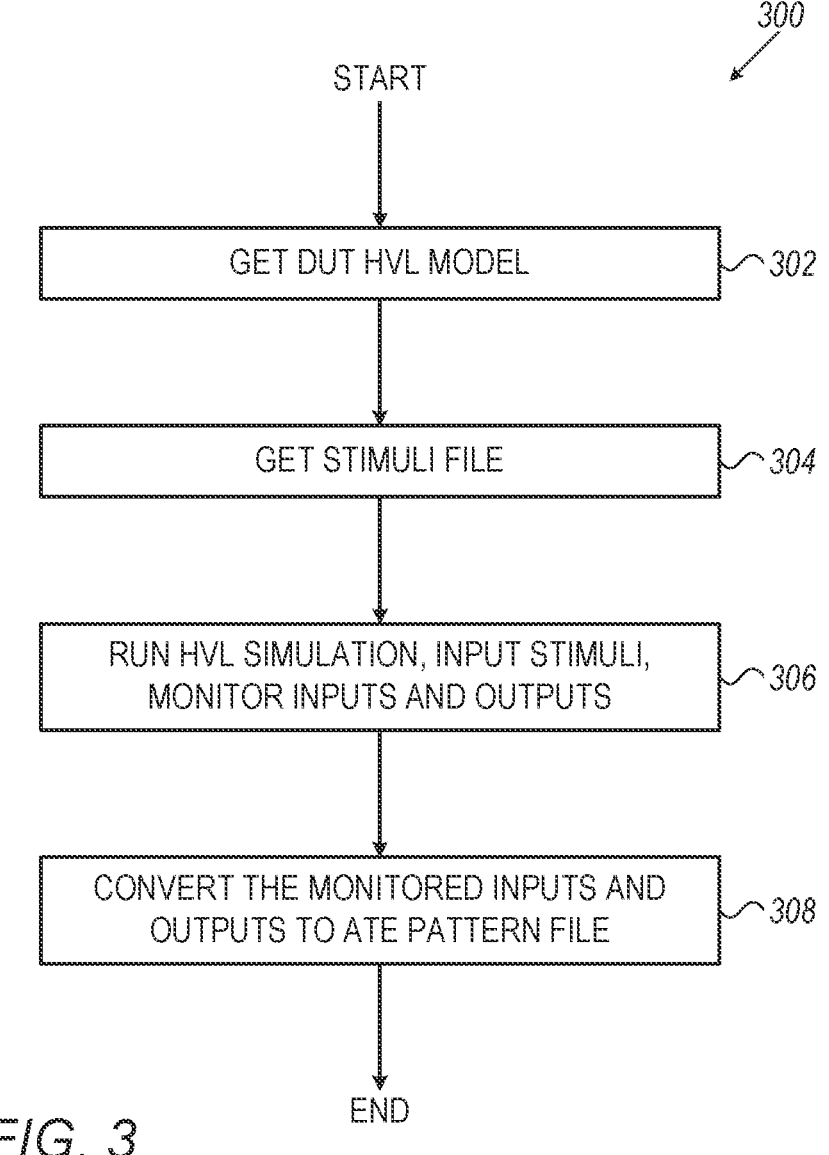
FIG. 3 is a flowchart that schematically illustrates a method for ATE pattern generation, in accordance with an embodiment of the present invention.

FIG. 3 is a flowchart 300 that schematically illustrates a method for ATE pattern generation, in accordance with an embodiment of the present invention. The flow is executed by computer 104 (FIG. 1).

The flow starts at a Get HVL Model operation 302, wherein the computer receives an HVL model of the Device Under Test (DUT). The HVL model is configured to model the output ports behavior of the DUT responsive to stimuli applied at the DUT input ports, obliviously to the internal structure of the DUT. (Typically, the correctness of the HVL model has been established during the development stage of the DUT.)

In embodiments, the HVL is written in e; in other embodiments, any other suitable HVL language may be used.

Next, at a Get Stimuli File operation 304, the computer receives a file that describes the stimuli to be applied to the DUT input ports. Typically, the stimuli file has been prepared by a test engineer and is designed to run a functional test of the DUT.

The computer then, at a Simulate operation 306, runs a simulation program that simulates the DUT operation using the HVL model. The computer applies stimuli as defined in the stimuli file, monitors all inputs and outputs and stores the logic states of the inputs and the outputs in an interim I/O log file. Lastly, at Convert to ATE Pattern operation 308, the computer runs a translation program that converts the interim I/O log file to a test pattern that is compatible with an ATE (e.g., a comma-separated-values (CSV) file). In an embodiment, the conversion program is written in a scripting language (e.g., Powershell, AWK or PERL).

The flowchart illustrated in FIG. 3 and described hereinabove is cited by way of example. Other flowcharts may be used in alternative embodiments. For example, in some embodiments, the translation of the interim I/O log to ATE test pattern may be done incrementally, whenever the simulator outputs input and output logic values.

The configurations of test pattern generation system 100, including computer 102, the contents of memory 110, and flowchart 300, illustrated in FIGS. 1 through 3 and described hereinabove, are example configurations and flowcharts that are shown purely for the sake of conceptual clarity. Any other suitable configurations and flowcharts can be used in alternative embodiments. The different sub-units of computer 104 may be implemented using suitable hardware, such as in one or more Application-Specific Integrated Circuits (ASICs) or Field-Programmable Gate Arrays (FPGAs), using software, using hardware, or using a combination of hardware and software elements.

computer 104 may comprise one or more general-purpose processors, which are programmed in software to carry out the functions described herein. The software may be downloaded to the processors in electronic form, over a network or from a host, for example, or it may, alternatively or additionally, be provided and/or stored on non-transitory tangible media, such as magnetic, optical, or electronic memory.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus for generating Automatic Test Equipment (ATE) testing patterns to test an electronic device-under-test (DUT) that comprises electrical circuitry, at least one input port and at least one output port, the apparatus comprising:
    a memory, configured to store:
        a high-level verification language (HVL) model of the IC, comprising a model input that models the at least one DUT input port and a model output that models the at least one DUT output port, the HVL model configured to determine, based on a logic state of the model input without modeling the electrical circuitry, a logic state of the model output responsively to a logic state of the model input; and
        a simulation program, configured to simulate the HVL model of the DUT and to monitor input and output ports during simulation and store monitored values in an input-output ports log file; and
    a processor, configured to generate an ATE testing pattern for the DUT by running the simulation program.

2. The apparatus according to claim 1, wherein the memory is further configured to store a translation program for translating the logic states of the model input and the model output into the ATE testing pattern, and wherein the processor is configured to generate the ATE testing pattern by running the translation program.

3. The apparatus according to claim 1, wherein the memory is further configured to store a stimuli file to indicate a stimulus to be applied to the model input.

4. The apparatus according to claim 1, wherein the processor is configured to store, in the memory, an interim I/O log file comprising the logic state of the model output.

5. The apparatus according to claim 4, wherein the processor is configured to store, in the interim I/O log file, high level debug simulation data.

6. The apparatus according to claim 1, wherein the memory is further configured to store a pattern file comprising the ATE testing pattern.

7. The apparatus according to claim 1, wherein the ATE testing pattern comprises a comma-separated-values (CSV) file.

8. A method for generating Automatic Test Equipment (ATE) testing patterns to test an electronic device-under-test (DUT) that comprises electrical circuitry, at least one input port and at least one output port, the method comprising:

storing in a memory a high-level verification language (HVL) model of the IC, comprising a model input that models the at least one DUT input port and a model output that models the at least one DUT output port, the HVL model configured to determine, based on a logic state of the model input without modeling the electrical circuitry, a logic state of the model output responsively to a logic state of the model input;

further storing in the memory a simulation program, configured to simulate the HVL model of the DUT and to monitor input and output ports during simulation and store monitored values in an input-output ports log file; and generating an ATE testing pattern for the DUT by running the simulation program.

9. The method according to claim 8, further comprising storing in the memory a translation program for translating the logic states of the model input and the model output into the ATE testing pattern, wherein generating the ATE testing pattern comprises running the translation program.

10. The method according to claim 8, further comprising storing in the memory a stimuli file to indicate a stimulus to be applied to the model input.

11. The method according to claim 8, further comprising storing in the memory an interim I/O log file comprising the logic state of the model output.

12. The method according to claim 11, further comprising storing, in the interim I/O log file, high level debug simulation data.

13. The method according to claim 8, further comprising storing in the memory a pattern file comprising the ATE testing pattern.

14. The method according to claim 8, wherein the ATE testing pattern comprises a comma-separated-values (CSV) file.

15. A computer software product for generating Automatic Test Equipment (ATE) testing patterns to test an electronic device-under-test (DUT) that comprises electrical circuitry, at least one input port and at least one output port, the product comprising a tangible non-transitory computer-readable medium in which program instructions are stored, which instructions, when read by a processor, cause the processor to:
    store in a memory a high-level verification language (HVL) model of the IC, comprising a model input that models the at least one DUT input port and a model output that models the at least one DUT output port, the HVL model configured to determine, based on a logic state of the model input without modeling the electrical circuitry, a logic state of the model output responsively to a logic state of the model input;
    further store in the memory a simulation program, configured to simulate the HVL model of the DUT and to monitor input and output ports during simulation and store monitored values in an input-output ports log file; and
    generate an ATE testing pattern for the DUT by running the simulation program.

* * * * *